(12) United States Patent
Wang et al.

(10) Patent No.: US 10,831,072 B2
(45) Date of Patent: Nov. 10, 2020

(54) LIGHT SHIELDING STRUCTURE AND LASER DEVICE

(71) Applicant: BOE TECHNOLOGY GROUP CO., LTD., Beijing (CN)

(72) Inventors: Xueyong Wang, Beijing (CN); Yan Chen, Beijing (CN); Feng Wang, Beijing (CN); Guozhong Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 223 days.

(21) Appl. No.: 16/027,689

(22) Filed: Jul. 5, 2018

(65) Prior Publication Data

US 2019/0113814 A1  Apr. 18, 2019

(30) Foreign Application Priority Data

Oct. 12, 2017 (CN) .......................... 2017 1 0947689

(51) Int. Cl.
| | |
|---|---|
| *G02B 26/02* | (2006.01) |
| *G02F 1/1362* | (2006.01) |
| *H01L 21/268* | (2006.01) |
| *G02F 1/13* | (2006.01) |

(52) U.S. Cl.
CPC ....... *G02F 1/136209* (2013.01); *G02B 26/02* (2013.01); *G02F 1/1303* (2013.01); *H01L 21/268* (2013.01)

(58) Field of Classification Search
CPC ............ G02F 1/136209; G02F 1/1303; H01L 21/268; H01L 21/324; G02B 26/02; G02B 5/005; G02B 5/00; B23K 26/0673; B23K 26/082; B23K 26/00
USPC ......................................................... 359/227
See application file for complete search history.

(56) References Cited

U.S. PATENT DOCUMENTS

| | | | | |
|---|---|---|---|---|
| 5,534,961 | A * | 7/1996 | Dowe ...................... | G03B 9/22 396/500 |
| 2008/0192464 | A1 * | 8/2008 | Cheng .................... | G03B 21/20 362/231 |

* cited by examiner

*Primary Examiner* — Euncha P Cherry
(74) *Attorney, Agent, or Firm* — Nath, Goldberg & Meyer; Joshua B. Goldberg

(57) ABSTRACT

The present disclosure relates to the field of display technology, and in particular relates to a light shielding structure and a laser device. The light shielding structure comprises a first light shielding plate group and a second light shielding plate group, each of the first light shielding plate group and the second light shielding plate group comprises at least one light shielding plate, and the at least one light shielding plate can be moved relatively for forming at least two light transmitting regions. The light shielding structure can realize partial scanning of multiple target regions at a time, thereby saving production time, increasing production efficiency, saving water and electricity and other resources, and prolonging the laser lifetime.

14 Claims, 2 Drawing Sheets the first direction

LIGHT SHIELDING STRUCTURE AND LASER DEVICE

CROSS-REFERENCE TO RELATED APPLICATION

This application claims the priority of China Patent Application No. 201710947689.2, filed in China on Oct. 12, 2017, the entire contents of which are hereby incorporated by reference.

TECHNICAL FIELD

The present disclosure relates to the field of display technology, and in particular relates to a light shielding structure and a laser device.

BACKGROUND

With the rise of planar display devices, Low-temperature Poly-Silicon (LTPS) technology has become a representation of high-quality display devices. In recent years, major panel makers have successively put production lines for the LTPS technology into production. The LTPS technology has developed rapidly and has a good prospect. The LTPS technology can be used not only for preparing a general liquid crystal display (LCD), but also for manufacturing processes of an organic light-emitting diode (OLED) and a flexible backplane. The Excimer Laser Annealing (ELA) process is an important part of the LTPS process.

In the ELA device, it is necessary to select the exposure region of the glass substrate through the light shielding plate, so as to selectively expose different regions.

SUMMARY

The embodiments of present disclosure provide a light shielding structure, comprising: a first light shielding plate group; and a second light shielding plate group, wherein each of the first light shielding plate group and the second light shielding plate group comprises at least one light shielding plate, and the at least one light shielding plate can be moved relatively for forming at least two light transmitting regions.

Optionally, the first light shielding plate group comprises a first light shielding plate and a second light shielding plate, an respective side of the first light shielding plate and an respective side of the second light shielding plate can mesh with each other to form a seamless shape; the first light shielding plate and the second light shielding plate can move along respective sides of each other so that the first light shielding plate and the second light shielding plate mesh with each other, and different light shielding widths are formed in a first direction in which light beam extends.

Optionally, edges of the first light shielding plate and the second light shielding plate near the light transmitting region are perpendicular to the first direction.

Optionally, the first light shielding plate and the second light shielding plate have triangle shapes with the same shape and size, and the respective side of the first light shielding plate and the respective side of the second light shielding plate are arranged as straight edges parallel to each other.

Optionally, the first light shielding plate and the second light shielding plate are right-angled triangles, and an oblique side of the first light shielding plate is the respective side of the first light shielding plate, and an oblique side of the second light shielding plate is the respective side of the second light shielding plate, and two right-angled sides of the first light shielding plate are parallel to the first direction and perpendicular to the first direction respectively, and two right-angled sides of the second light shielding plate are parallel to the first direction and perpendicular to the first direction respectively.

Optionally, the light shielding structure according to claim 2, wherein the light shielding structure further comprises a first guide group and a second guide group, the first guide group comprises a first guide and a third guide which are parallel to each other; the second guide group comprises a second guide and a fourth guide which are parallel to each other; and an extending direction of the first guide and an extending direction of the second guide are perpendicular to each other; the first guide is disposed on the second guide, the first light shielding plate is disposed on the first guide, the third guide is disposed on the fourth guide, and the second light shielding plate is disposed on the third guide.

Optionally, the first light shielding plate group comprises a first light shielding plate, the first light shielding plate has a rectangular shape, and a moving direction of the first light shielding plate is provided to be perpendicular to a first direction in which light beam extends.

Optionally, the light shielding structure further comprises a first guide group and a second guide group, the first guide group comprises a first guide, and the second guide group comprises a second guide; an extending direction of the first guide and an extending direction of the second guide are perpendicular to each other, the first guide is disposed on the second guide, and the first light shielding plate is disposed on the first guide.

Optionally, the extending direction of the first guide or the second guide is parallel to the first direction.

Optionally, the extending direction of the first guide or the second guide is parallel to the first direction.

Optionally, the second light shielding plate group comprises a third light shielding plate and a fourth light shielding plate, and the third light shielding plate and the fourth light shielding plate are disposed along a first direction in which light beam extends and can move in the first direction.

Optionally, all light shielding plates of the first light shielding plate group and the second light shielding plate group are in the same plane.

A laser device, comprising: a workpiece carrier; and a laser disposed opposite to the workpiece carrier, wherein the laser forming a strip beam, and a light shielding structure is disposed between the workpiece carrier and the laser, the light shielding structure is the light shielding structure mentioned above.

Optionally, one of the laser and the workpiece carrier is fixedly disposed, and the other can be moved back and forth in a direction perpendicular to an extending direction of the stripe beam of the laser.

Optionally, the laser device comprises an excimer laser annealing device and a laser lift-off device.

DETAILED DESCRIPTION OF THE EMBODIMENTS

To enable those skilled in the art to better understand the technical solutions of the present disclosure, the light shielding structure and the laser device of the present disclosure will be further described in detail below in conjunction with the accompanying drawings and specific embodiments.

The embodiments of the present disclosure provide a light shielding structure. The light shielding structure can partition one strip beam, so as to scan more than two target regions of a workpiece to be scanned simultaneously via one strip beam. Therefore, it could achieve technical effects that: saving production time, increasing production efficiency, and saving water, electricity and other resources, prolonging the laser lifetime of strip beam generators (e.g. laser devices).

The light shielding structure is used for partitioning and blocking the strip beam. The light shielding structure comprises a first light shielding plate group and a second light shielding plate group. Each of the first light shielding plate group and the second light shielding plate group comprises at least one light shielding plate. Each of the light shielding plates can relatively move, such that the light shielding structure forms at least two light transmitting regions.

Figure 1:
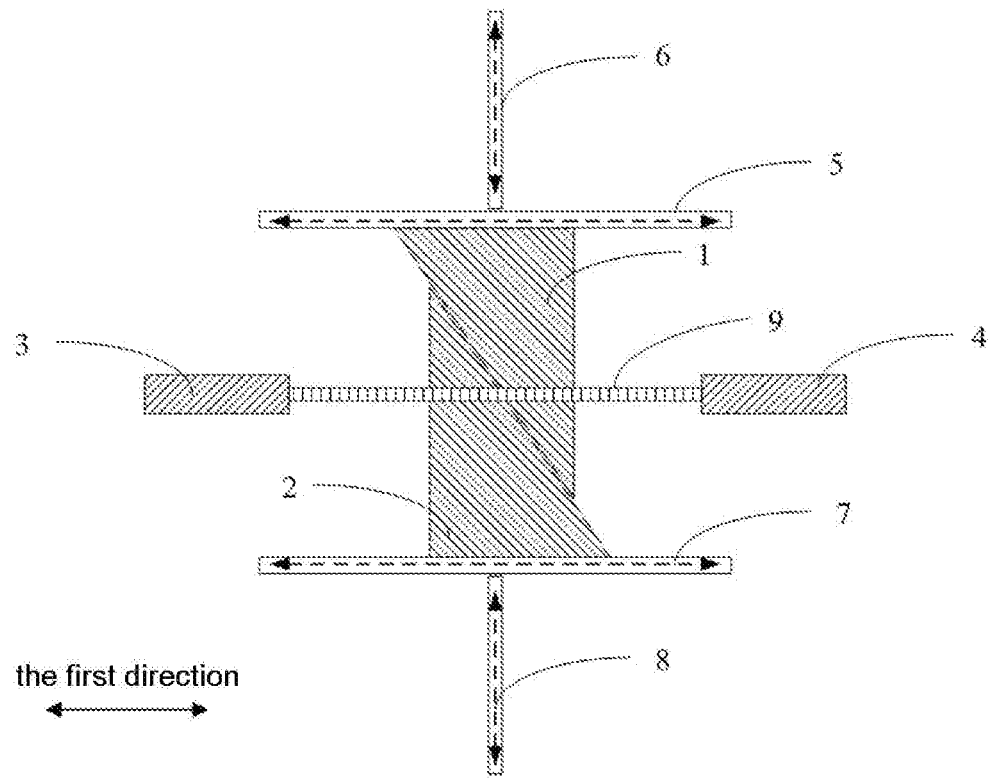
FIG. 1 is a schematic structural view of a light shielding structure in an embodiment of the present disclosure.

As shown in FIG. 1, the first light shielding plate group and the second light shielding plate group are disposed in two directions which are perpendicular to each other. Arrangement direction of any one of the first light shielding plate group and the second light shielding plate group is same as an extending direction of the strip beam 9. Each of the first light shielding plate group and the second light shielding plate group comprises at least one movable light shielding plate. With respect to a center of a moving range formed by a plurality of light shielding plates, each light shielding plate can be relatively moved toward or away from the center, so that the light shielding plate partitions the strip beam 9 into at least two regions. In other words, the light shielding structure forms at least two light transmitting regions. The light shielding plate group separates two light-transmitting regions from each other. Taking an excimer laser annealing (ELA) device as an example, the light shielding plate structure of the first light shielding plate group can be disposed to be perpendicular to the laser beam of the laser. The light shielding plate structure of the second light shielding plate group can be disposed on both sides of the laser, so as to block laser beams of the laser on both sides. Here, the extending direction of the stripe beam is defined as a first direction (i.e. the left-right direction in FIG. 1). Therefore, when there may be two or more separate regions needed to be scanned on the same glass substrate, the light shielding structure of the present embodiment could be applied to solve the following problems: the current laser annealing device can only scan separately in a single region, that is difficult to meet the production requirements; in the laser lift-off device (LLO), there is also the same problem that only one region can be scanned. Accordingly, the light shielding structure of the present embodiment could partition the scanning region of the workpiece in the laser device, and scan a plurality of regions by the laser at a time.

The first light shielding plate group may comprise a first light shielding plate 1 and a second light shielding plate 2. An respective side of the first light shielding plate 1 and an respective side of the second light shielding plate 2 can mesh with each other to form a seamless shape. The first light shielding plate 1 and the second light shielding plate 2 can move along respective sides of each other (in this state, the first light shielding plate 1 and the second light shielding plate 2 mesh with each other), so that different light shielding widths are formed by the first light shielding plate 1 and the second light shielding plate 2 in the first direction in which light beam extends. By disposing the respective sides of the first light shielding plate 1 and the second light shielding plate 2 to mesh with each other, it can be ensured that there is no gap between the first light shielding plate 1 and the second light shielding plate 2, and further ensured the light beam can be fully blocked.

Optionally, the first light shielding plate 1 and the second light shielding plate 2 may be disposed to be vertically movable relative to the first direction, so as to the light shielding width in the first direction. When the respective sides of the two light shielding plates fit together in a large extent, the overall width formed by the first light shielding plate 1 and the second light shielding plate 2 in the first direction is large, and therefore the light shielding width is large. When the respective sides of the two light shielding plates fit together in a small extent, the overall width formed by the first light shielding plate 1 and the second light shielding plate 2 in the first direction is small, and therefore the light shielding width is small. Therefore, according to the size of the two target regions to be scanned in the first direction, the degree of engagement between the respective sides of the first light shielding plate 1 and the second light shielding plate 2 can be adjusted. As a result, the width of the light shielding region in the first direction can be adjusted, so as to obtain two different locations and different widths of the target regions on both sides.

In FIG. 1, the first light shielding plate 1 and the second light shielding plate 2 are triangles with the same shape and size. The respective side of the first light shielding plate and the respective side of the second light shielding plate are disposed as straight edges parallel to each other. The light shielding structure can perform an adjustment to the light shielding plates of the first light shielding plate 1 and the second light shielding plate 2 in four directions (left, right, front and rear), so as to scan multiple target regions at a time.

Optionally, the first light shielding plate 1 and the second light shielding plate 2 are right-angled triangles. An oblique side of the first light shielding plate is the respective side of the first light shielding plate, and an oblique side of the second light shielding plate is the respective side of the second light shielding plate the right-angled triangle is the respective side. Two right-angled sides of the first light shielding plate are parallel to the first direction and perpendicular to the first direction respectively, and two right-angled sides of the second light shielding plate are parallel to the first direction and perpendicular to the first direction respectively. By disposing the two right-angled sides of each light shielding plate to be parallel and perpendicular to the first direction respectively, it can conveniently control the movement of the light shielding region with respect to the strip-shaped light source and adjust the area of the light shielding region. More importantly, when two oblique sides (facing to each other) of the two light shielding plates do not mesh with each other but form a certain gap, an another light transmitting target region to be scanned is also formed between the oblique sides of two right-angled triangles, so that as to scan three target regions at a time.

In addition, in normal conditions, the strip beam is generated by the laser, and the light shielding structure is disposed between the laser and the workpiece to be scanned. The initial laser beam has a certain length and width (for example, 370 mm*50 mm), and the laser beam is focused in a straight line when scanning onto the workpiece to be scanned (e.g. 370 mm*0.4 mm). Thus, the width of the laser beam that irradiates on the light shielding plate is between 50 mm and 0.4 mm. The two right-angled sides of the each right-angled triangle are provided to be parallel and perpendicular to the stripe beam respectively. It is also beneficial to ensure that the energy of the beams on both sides is consistent when the light shielding plate forms the target region, so that the energy focused on the workpiece to be scanned is uniform.

Optionally, the edges of the first light shielding plate 1 and the second light shielding plate 2 close to the light transmitting region are perpendicular to the first direction, so as to prevent uneven light at the edges.

In order to control the light shielding plate, the light shielding structure further comprises a first guide group and a second guide group. The first guide group comprises a first guide 5 and a third guide 7 which are parallel to each other. The second guide group comprises a second guide 6 and a fourth guide 8 which are parallel to each other. An extending direction of the first guide 5 and an extending direction of the second guide 6 are perpendicular to each other. The first guide 5 is disposed on the second guide 6, and the first light shielding plate 1 is disposed on the first guide 5. The third guide 7 is disposed on the fourth guide 8, and the second light shielding plate 2 is disposed on the third guide 7. Here, "A is disposed on B" means that A and B are connected together, and A can move along with B.

Figure 2:
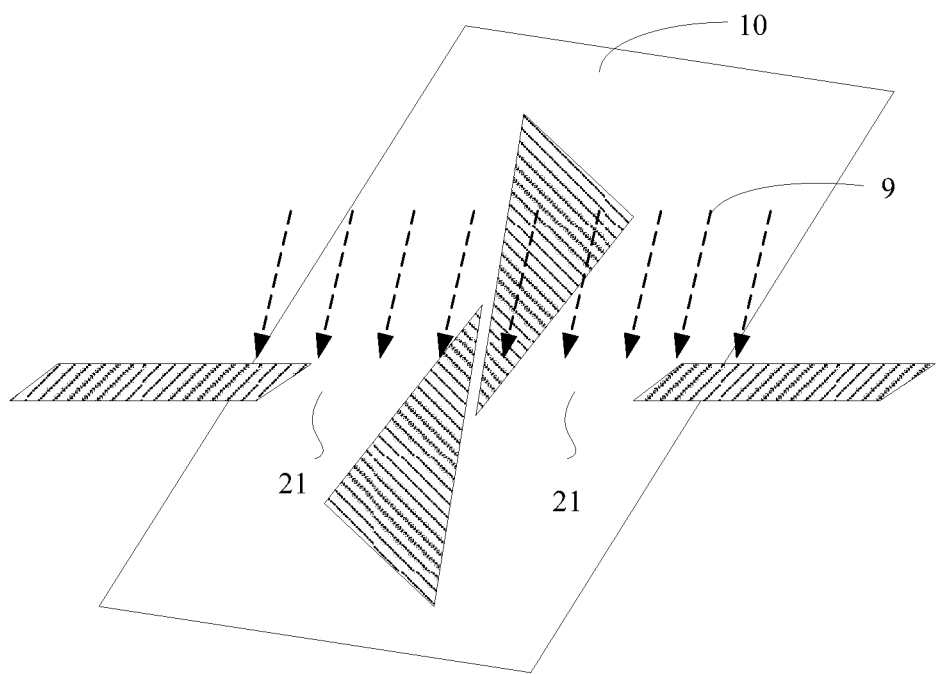
FIG. 2 is a schematic view of light shielding of the light shielding structure in an embodiment of the present disclosure.

Through the guide, the first light shielding plate 1 and the second light shielding plate 2 can be respectively moved together or moved apart, so as to adjust the shape and size of the light transmitting region. Referring to FIG. 2, when the first light shielding plate 1 and the second light shielding plate 2 are moved together (the respective sides of the first light shielding plate 1 and the second light shielding plate 2 gradually mesh with each other), the light shielding region in the middle of the stripe beam will gradually increase, the light transmitting regions 21 on both sides decreases. Conversely, when the first light shielding plate 1 and the second light shielding plate 2 are moved apart (the respective sides of the first light shielding plate 1 and the second light shielding plate 2 are gradually separated from each other), the light shielding region in the middle of the stripe light beam will gradually decrease (even without the light shielding region), and the light transmitting regions 21 on both sides increase. In addition, when the first light shielding plate 1 and the second light shielding plate are meshed with each other, the first light shielding plate 1 and the second light shielding plate 2 can also be moved together along the extending direction of the stripe beams (that is, the left and right directions of the paper surface in FIG. 1), so as to adjust a position of the entire light shielding region formed by the first light shielding plate 1 and the second light shielding plate 2 in the middle of the strip beam. Alternatively, a distance between the respective sides of the first light shielding plate 1 and the second light shielding plate 2 could be adjusted, so as to scan the third target region in the middle of the stripe beam.

Optionally, the movement of the first light shielding plate 1 along the first guide 5 and the second guide 6 is driven by a motor, and the movement of the second light shielding plate 2 along the third guide 7 and the fourth guide 8 is also driven by a motor. In this way, the power driving the first light shielding plate 1 and the second light shielding plate 2 is controlled by the motor. Therefore, the movement of the first light shielding plate 1 and the second light shielding plate 2 in parallel or perpendicular to the first direction could be adjusted, so as to scan two or three target regions at a time.

Optionally, the extending direction of the first guide 5 or the second guide 6 is parallel to the first direction. By setting the arrangement direction of the guides of the movable light shielding plate, the movement of the light shielding plate in two mutually perpendicular directions is achieved.

In FIG. 1, the second light shielding plate group comprises a third light shielding plate 3 and a fourth light shielding plate 4. The third light shielding plate 3 and the fourth light shielding plate 4 are disposed in the first direction and can be moved in the first direction respectively. Through the third light shielding plate 3 and the fourth light shielding plate 4 in the second light shielding plate group, which cooperating with the first light shielding plate 1 and the second light shielding plate 2 in the first light shielding plate group, adjustment to scanning area of two or three target regions is achieved.

As shown in FIG. 1, the first light shielding 1, the second light shielding 2 are mounted on one of the two guide groups, and the third light shielding 3 and the fourth light shielding 4 are mounted on another guide group. The two guide groups can move in two directions which are perpendicular to each other. For example, the first light shielding plate 1 is firstly mounted on the first guide 5, and then the first light shielding plate 1 together with the first guide 5 is mounted on the second guide 6. Alternatively, the first light shielding plate 1 is firstly mounted to the second guide 6, and then the first light shielding plate 1 together with the second guide 6 is mounted on the first guide 5. As a result, the first light shielding could be moved in any directions (e.g. the front, rear, left and right directions). The installation method of other light shielding plates is the same as above and will not be described in detail here.

Definitely, with the development of technology and improvement of control methods, the first light shielding plate 1, the second light shielding plate 2, the third light shielding plate 3, and the fourth light shielding plate 4 can also be respectively disposed on one guide, and the light shielding plates on the guide can be controlled to move in two mutually perpendicular directions.

Optionally, all light shielding plates of the first light shielding plate group and the second light shielding plate group are in the same plane. As shown in FIG. 1, the light shielding structure comprises not only the left and right light shielding plates, but also two triangular light shielding plates in the front and rear, and the four light shielding plates are in the same plane (horizontal position). When the first light shielding plate 1, the second light shielding plate 2, the third light shielding plate 3 and the fourth light shielding plate 4 are all located on the same plane, only the area of the target region needs to be considered when adjusting light shielding plate via the motor. There is no need to consider the additional projected area due to the tilt arrangement of the light shielding plate, which is advantageous for simplifying the control procedure.

Figure 3:
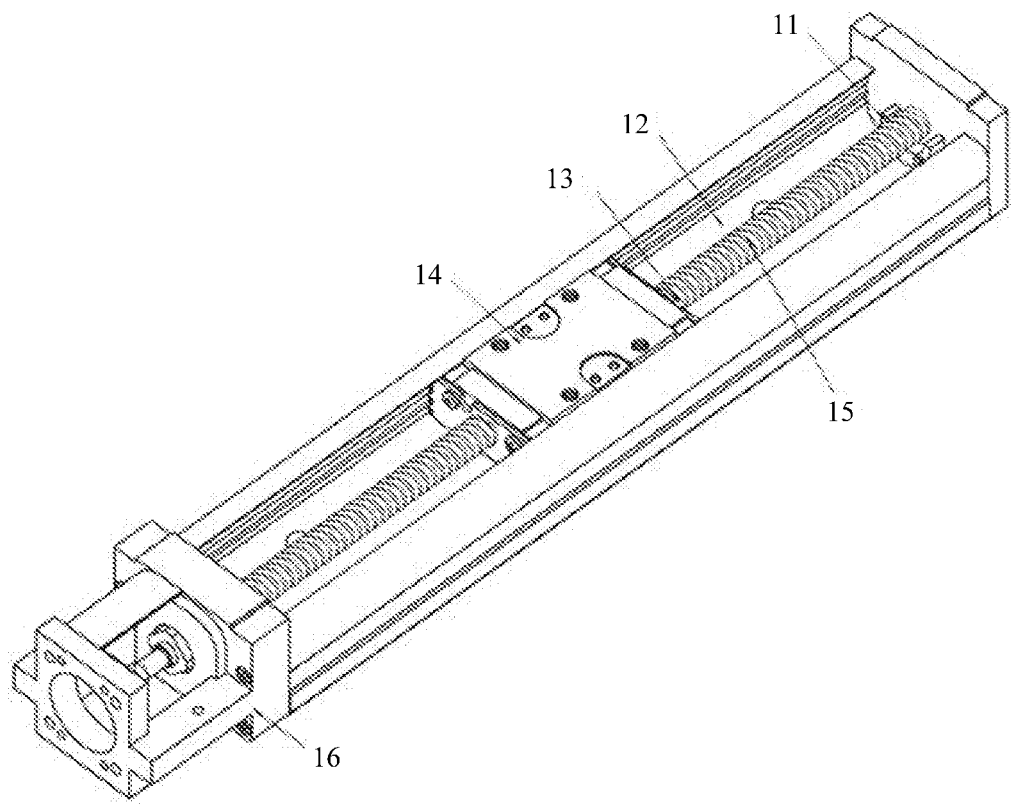
FIG. 3 is a schematic view of a guide structure in FIG. 1.

For the trajectories of the first light shielding plate 1, the second light shielding plate 2, the third light shielding plate 3 and the fourth light shielding plate 4, a guide structure as shown in FIG. 3 may be used. The guide structure comprises a stopper 11, a guide 12, a slider screw connection 13, a slider 14, a ball screw 15, and a motor bracket 16. During the position adjustment of the light shielding plate, a motor controller controls the rotation speed of the motor by sending a pulse command to the motor, thereby controlling the movement distance of the light shielding plate, and finally controlling the specific position of the light shielding plate.

The light shielding structure can scan multiple target regions at a time, and scan two or three target regions of a workpiece to be scanned, thereby saving production time, improving production efficiency, saving water and electricity, and prolonging the laser lifetime of the laser device.

The embodiments of the present disclosure provide a light shielding structure. The light shielding structure can realize that a strip beam scans two target regions of a workpiece to be scanned simultaneously, thereby improving production efficiency.

Figure 4:
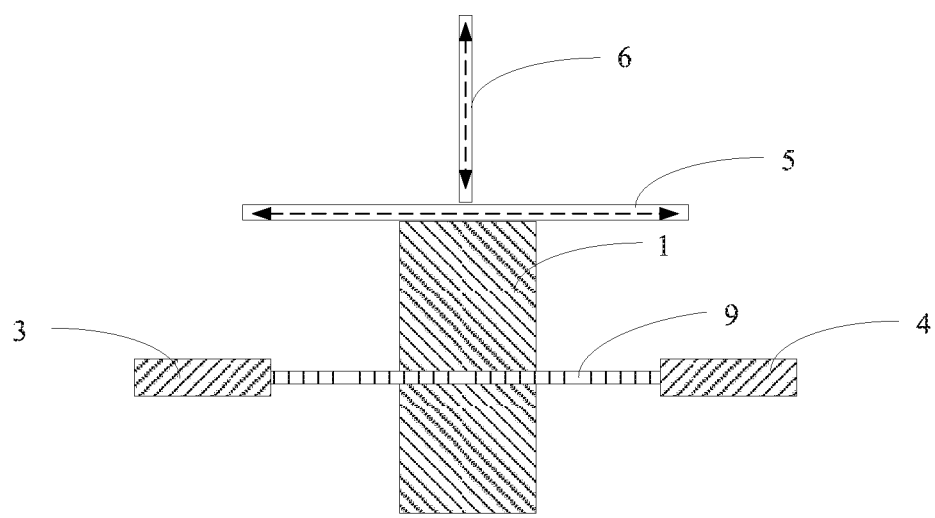
FIG. 4 is a schematic view of light shielding of the light shielding structure in an embodiment of the present disclosure.

As shown in FIG. 4, in the light shielding structure, the first light shielding plate group comprises a first light shielding plate 1. The first light shielding plate 1 has a rectangular shape. Moving direction of the first light shielding plate 1 is provided to be perpendicular to a first direction.

It is easy to understand that, the light shielding structure further comprises a first guide group and a second guide group. The first guide group comprises a first guide 5, and the second guide group comprises a second guide 6. An extending direction of the first guide 5 and an extending direction of the second guide 6 are perpendicular to each other. The first guide 5 is disposed on the second guide 6, and the first light shielding plate 1 is disposed on the first guide 5.

Optionally, the movement of the first light shielding plate 1 along the first guide 5 and the second guide 6 is driven by a motor. In this way, the power driving the first light shielding plate 1 is controlled by the motor. Therefore, the movement of the first light shielding plate 1 in parallel or perpendicular to the first direction is adjusted, so as to scan two current regions in sequence.

The light shielding structure in this embodiment is simple, and the control is also more convenient. In the case that scanning two target regions partitioned in the first direction, the control is more convenient. However, with respect to applications for different area of light shielding regions, the first light shielding plate 1 needs to be replaced with different widths.

The light shielding structure can scan multiple target regions at a time, and simultaneously scan two or three target regions of a workpiece to be scanned, thereby saving production time, improving production efficiency, saving water and electricity, and prolonging the laser lifetime of the laser device.

The embodiments of the present disclosure are particularly suitable for an excimer laser annealing (ELA) device and a laser thin film separation device. Comparing with the current laser device that can only scan a single region, the light shielding structure can scan multiple target regions at a time. Therefore, it could achieve technical effects that: saving production time, improving production efficiency, saving water and electricity, and prolonging the laser lifetime of the laser device.

The embodiments of the present disclosure provide a laser device. The laser device comprises a workpiece carrier and a laser disposed opposite to the workpiece carrier. The laser forms a strip beam. A light shielding structure is disposed between the workpiece carrier and the laser. The light shielding structure is the light shielding structure according to the embodiments of the present disclosure.

The light shielding structure comprises a plurality of movable light shielding plates that can be moved close to or away from the center of the beam of the laser. The light shielding plate partitions the light beam irradiated from the laser toward the workpiece carrier into at least two regions.

Optionally, one of the laser and the workpiece carrier is fixedly disposed, and the other could be moved back and forth in a direction perpendicular to an extending direction of the stripe beam of the laser. This reciprocating movement (moves back and forth) is in the plane where one of the laser and the workpiece carrier is located. Regardless of the laser or the workpiece to be scanned being moved, the light shielding plate can be used to scan the workpiece to be scanned in multiple target regions at a time.

Here, the laser device comprises an excimer laser annealing device and a laser lift-off device. Applying the light shielding structure in the embodiments of the present disclosure can greatly improve the production efficiency of the excimer laser annealing device and the laser thin film separation device, save production time, save water and electricity and other resources, and prolong the service life of the device.

It can be understood that the above embodiments are merely exemplary embodiments employed for illustrating the principle of the present disclosure, but the present disclosure is not limited thereto. For a person of ordinary skilled in the art, various variations and improvements may be made without departing from the spirit and essence of the present disclosure, and these variations and improvements are also considered to be within the protection scope of the present disclosure.

The invention claimed is:

1. A light shielding structure, comprising:
a first light shielding plate group; and
a second light shielding plate group,
wherein each of the first light shielding plate group and the second light shielding plate group comprises at least one light shielding plate, and the at least one light shielding plate is moveable relatively for forming at least two light transmitting regions,
wherein the first light shielding plate group comprises a first light shielding plate and a second light shielding plate, an respective side of the first light shielding plate and an respective side of the second light shielding plate mesh with each other to form a seamless shape; the first light shielding plate and the second light shielding plate are movable along the respective sides of each other so that the first light shielding plate and the second light shielding plate mesh with each other, and different light shielding widths are formed in a first direction in which light beam extends.

2. The light shielding structure according to claim 1, wherein edges of the first light shielding plate and the second light shielding plate near the light transmitting region are perpendicular to the first direction.

3. The light shielding structure according to claim 1, wherein the first light shielding plate and the second light shielding plate have triangle shapes with the same shape and size, and the respective side of the first light shielding plate and the respective side of the second light shielding plate are arranged as straight edges parallel to each other.

4. The light shielding structure according to claim 1, wherein the first light shielding plate and the second light shielding plate are right-angled triangles, and an oblique side of the first light shielding plate is the respective side of the first light shielding plate, and an oblique side of the second light shielding plate is the respective side of the second light shielding plate, and two right-angled sides of the first light shielding plate are parallel to the first direction and perpendicular to the first direction respectively, and two right-angled sides of the second light shielding plate are parallel to the first direction and perpendicular to the first direction respectively.

5. The light shielding structure according to claim 1, wherein the light shielding structure further comprises a first guide group and a second guide group, the first guide group comprises a first guide and a third guide which are parallel to each other; the second guide group comprises a second guide and a fourth guide which are parallel to each other; and an extending direction of the first guide and an extending direction of the second guide are perpendicular to each other;

the first guide is disposed on the second guide, the first light shielding plate is disposed on the first guide, the third guide is disposed on the fourth guide, and the second light shielding plate is disposed on the third guide.

6. The light shielding structure according to claim 1, wherein the first light shielding plate group comprises a first light shielding plate, the first light shielding plate has a rectangular shape, and a moving direction of the first light shielding plate is provided to be perpendicular to a first direction in which light beam extends.

7. The light shielding structure according to claim 6, wherein the light shielding structure further comprises a first guide group and a second guide group, the first guide group comprises a first guide, and the second guide group comprises a second guide; an extending direction of the first guide and an extending direction of the second guide are perpendicular to each other, the first guide is disposed on the second guide, and the first light shielding plate is disposed on the first guide.

8. The light shielding structure according to claim 5, wherein the extending direction of the first guide or the second guide is parallel to the first direction.

9. The light shielding structure according to claim 7, wherein the extending direction of the first guide or the second guide is parallel to the first direction.

10. The light shielding structure according to claim 1, wherein the second light shielding plate group comprises a third light shielding plate and a fourth light shielding plate, and the third light shielding plate and the fourth light shielding plate are disposed along the first direction and movable in the first direction.

11. The light shielding structure according to claim 10, wherein all light shielding plates of the first light shielding plate group and the second light shielding plate group are in the same plane.

12. A laser device, comprising:
a workpiece carrier; and
a laser disposed opposite to the workpiece carrier,
wherein the laser forming a strip beam, and a light shielding structure is disposed between the workpiece carrier and the laser, the light shielding structure is the light shielding structure according to claim 1.

13. The laser device according to claim 12, wherein one of the laser and the workpiece carrier is fixedly disposed, and the other is movable back and forth in a direction perpendicular to an extending direction of the stripe beam of the laser.

14. The laser device according to claim 12, wherein the laser device comprises an excimer laser annealing device and a laser lift-off device.

* * * * *